United States Patent [19]
Ridgway et al.

[11] Patent Number: 5,411,817
[45] Date of Patent: May 2, 1995

[54] BATTERY WITH CHARGE INDICATOR

[75] Inventors: Michael Ridgway, Aldbury; Stephen J. Edwards, Pinner; Christopher P. Moore, Rayners Lane Harrow, all of Great Britain

[73] Assignee: Eastman Kodak Company, Rochester, N.Y.

[21] Appl. No.: 975,562

[22] PCT Filed: Aug. 6, 1991

[86] PCT No.: PCT/EP91/01478
§ 371 Date: Jul. 16, 1993
§ 102(e) Date: Jul. 16, 1993

[87] PCT Pub. No.: WO92/03852
PCT Pub. Date: Mar. 5, 1992

[30] Foreign Application Priority Data

Aug. 11, 1990 [GB] United Kingdom ................ 9017668

[51] Int. Cl.⁶ .............................................. H01M 2/02
[52] U.S. Cl. ....................................... 429/90; 429/91; 429/92; 429/93; 324/435

[58] Field of Search ...................... 429/90, 91, 92, 93; 329/435

[56] References Cited

U.S. PATENT DOCUMENTS 1,497,388  11/1922  Sterling .
4,917,973   4/1990  Yoshimoto et al. .................. 429/91
5,156,931  10/1992  Burroughs et al. .................. 429/93

FOREIGN PATENT DOCUMENTS

58/032376  8/1981  Japan .
59-016283  1/1984  Japan .
60-66170   4/1985  Japan .
9306474    4/1993  WIPO .

*Primary Examiner*—Stephen Kalafut
*Assistant Examiner*—M. Nuzzolillo
*Attorney, Agent, or Firm*—John R. Everett

[57] ABSTRACT

An electrochemical device for providing a visual indication of the remaining life of a battery, the device comprising an electrode pair with a layer therebetween, the layer comprising a mixture of a photographic color coupler dispersion, an antioxidant and a photographic color developer in a binder.

9 Claims, 3 Drawing Sheets

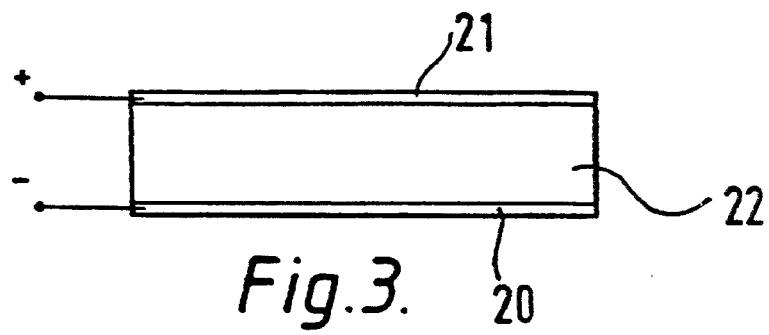
Fig. 3.
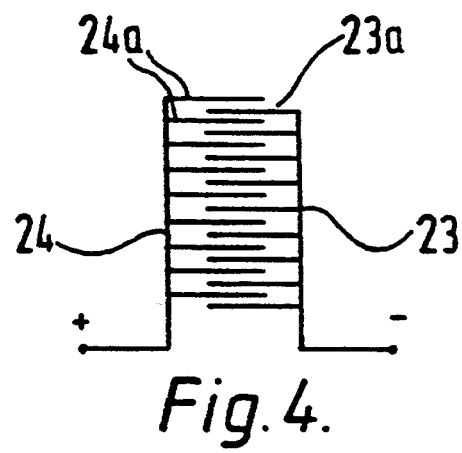
Fig. 4.
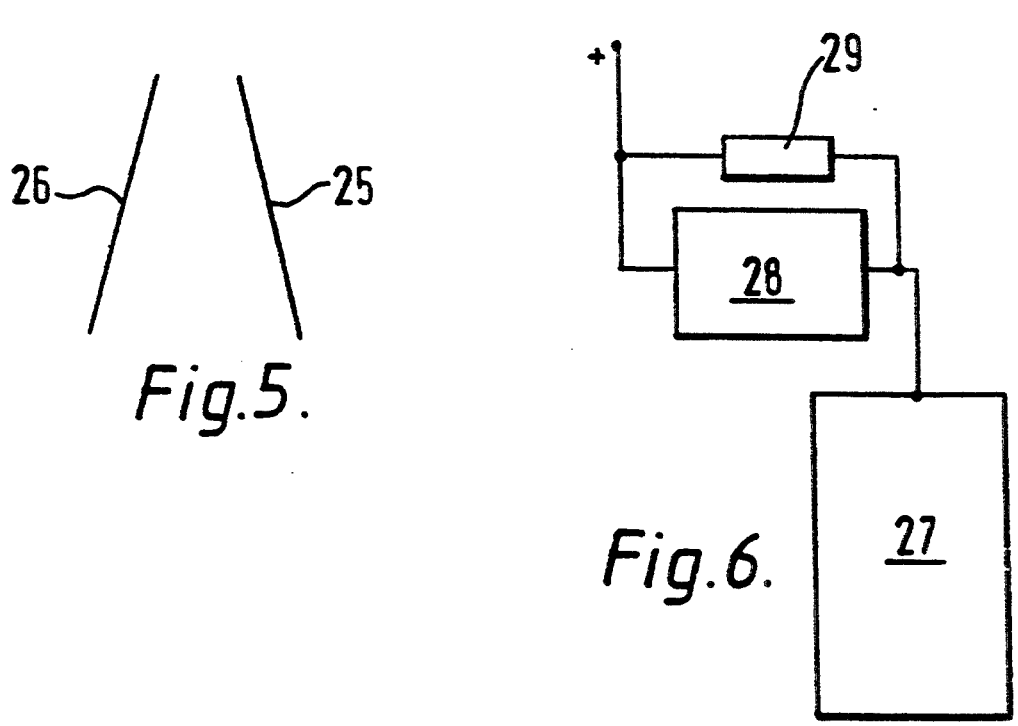
Fig. 5.
Fig. 6.

BATTERY WITH CHARGE INDICATOR

This invention relates to batteries, and is particularly concerned with indicators which can be used with batteries to show how much battery life remains.

It is known to determine battery power by measuring the voltage of the battery when it is under load, or alternatively by measuring the temperature that a conductor reaches when connected to the battery. Both the measurement of voltage and temperature require the use of a device which is external to the battery, and if such a device is permanently built-in to the battery, it may present a serious risk of accidental battery discharge. Furthermore, such devices do not work well when used to determine the power of a battery which has a flat power discharge characteristic. Moreover, such devices are intrinsically expensive in terms of power use of the battery itself, and cannot be used in conjunction with batteries which operate at very low power levels, for example batteries which are used in watches and hearing aids.

It is an object of the present invention to provide a method of producing a simple, inexpensive device which indicates remaining battery life.

It is a further object that such a device can be used on any type of battery.

According to one aspect of the present invention, there is provided a method of producing a battery which provides a visual indication of its remaining life characterized in that an electrochemical device is attached to the battery, so that as charge is drawn from the battery through the device, an electrochemical process produces an optical change in the device.

The electrochemical action may be either an oxidized reaction at the anode or a reducing reaction at the cathode.

According to a second aspect of the present invention, there is provided an electrochemical device for providing a visual indication of the remaining life of a battery, the device comprising an electrode pair with a layer therebetween, the layer comprising a mixture of a photographic color coupler dispersion, an antioxidant and a photographic color developer in a binder.

The electrodes may take several forms, for example they may be in the form of a mesh electrode and a flat electrode. Alternatively, the electrodes can be formed as printed circuit electrodes, preferably on a transparent substrate.

For a better understanding of the invention, reference will now be made, by way of example only, to the accompanying drawings in which:

FIG. 3 illustrates one embodiment of an electrochemical device according to the invention;

FIG. 4 illustrates another embodiment of an electrochemical device according to the invention;

FIG. 5 illustrates a further embodiment of an electrochemical device according to the invention; and FIG. 6 is a schematic circuit diagram of a battery incorporating the electrochemical device of any one of FIGS. 3 to 5.

Figure 1:
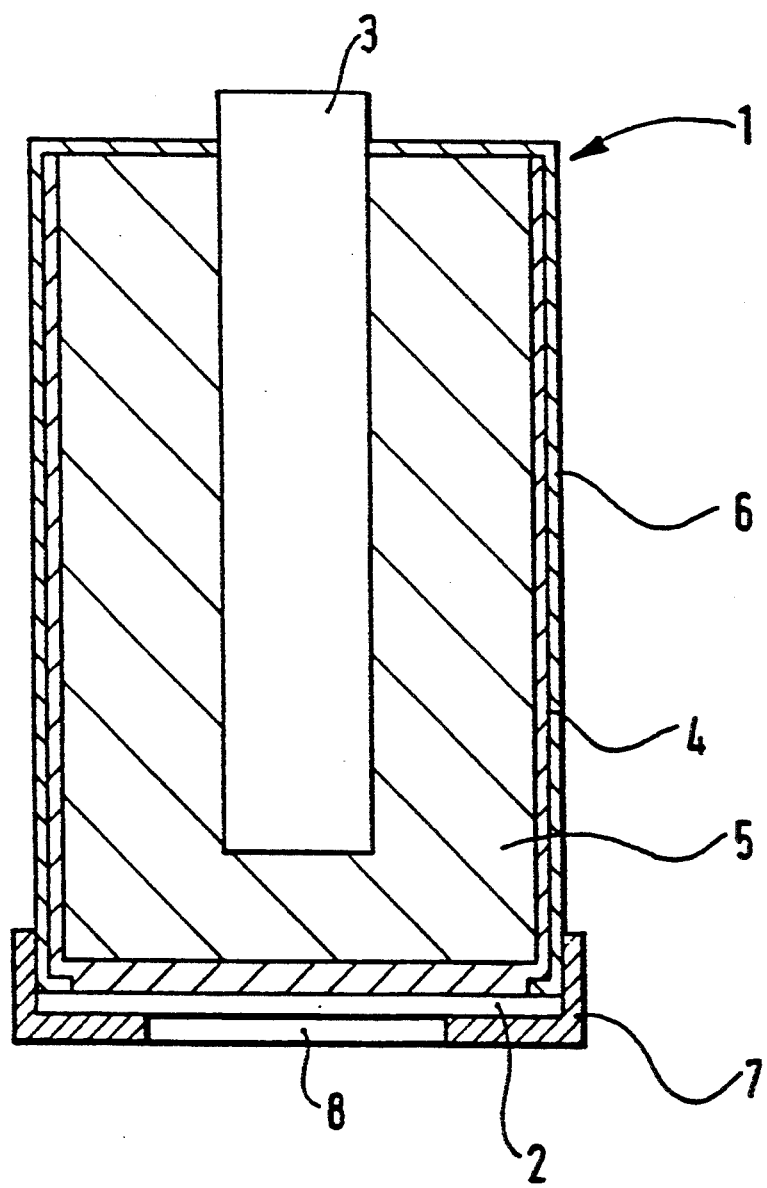
FIG. 1 is a schematic diagram of a battery incorporating an electrochemical device according to the invention.

FIG. 1 shows a dry cell battery 1 which includes an electrochemical device 2 according to the invention. The battery 1 comprises an anode 3, a cathode 4, and an electrolyte 5 positioned between the anode and the cathode, the anode 3, cathode 4, and electrolyte 5 all being mounted in a casing 6.

The electrochemical device 2 is attached to the battery 1 by an end cap 7 at the base of battery, namely adjacent the cathode 4. The end cap 7 has an aperture 8 formed in it through which electrical connections (not shown) can be made to the device 2.

The device 2 is connected in series with the battery, so that at least a proportion of the current being drawn from the battery 1 passes through it.

Figure 2:
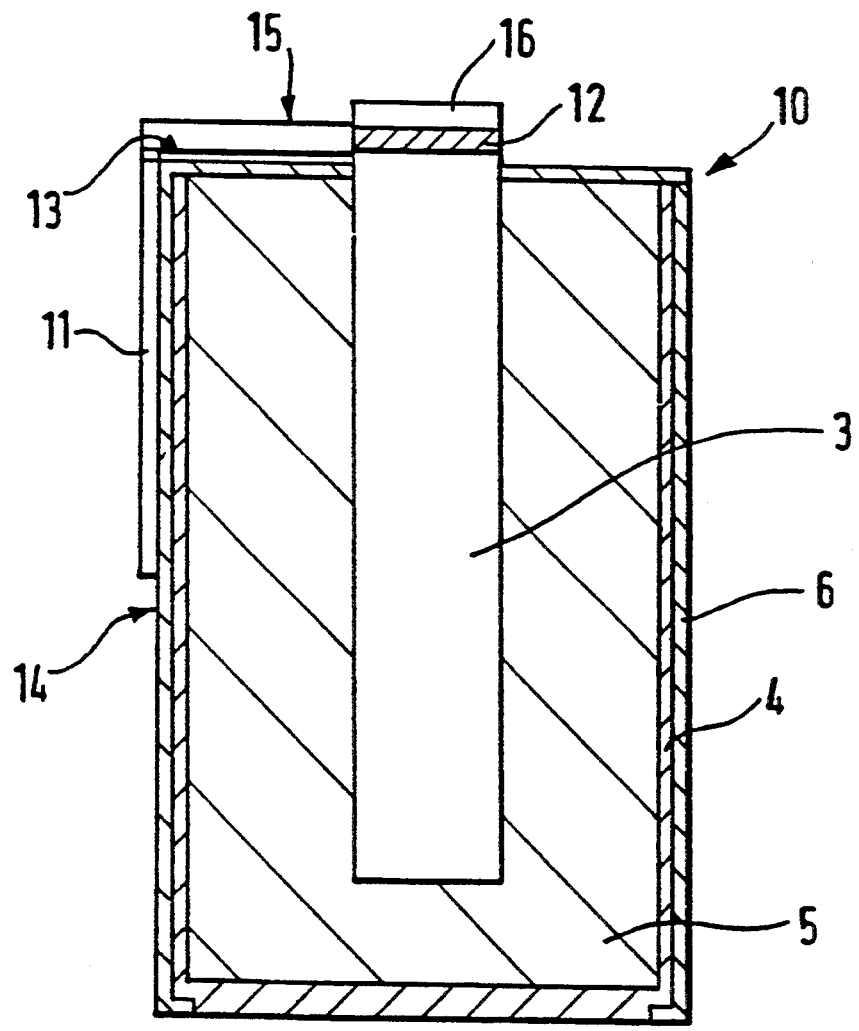
FIG. 2 is a schematic diagram of a further battery incorporating a further electrochemical device according to the invention.

In FIG. 2, a second dry cell battery 10 incorporating an electrochemical device 11 is shown. The battery 10 is constructed as described with reference to FIG. 1 and like components are labelled the same. In this embodiment, an insulating spacer 12 is formed in the anode 3. A connection 13 runs from the anode 3 to the electrochemical device 11 on the outer surface 14 of the battery 10. A further electrical connection 15 completes the connection from the electrochemical device 11 to a further portion 16 of the anode 3.

Electrochemical devices 2, 11 can be constructed using a pair of suitable electrodes together with an electrolyte which alters color as charge is passed through it.

FIGS. 3 to 5 illustrate various possible electrode arrangements. In FIG. 3, a cathode 20 is spaced from an anode 21 by an electrolyte 22. Either one of the anode 21 or cathode 20 can be in the form of a fine mesh electrode and the other electrode could be a flat plate electrode.

In FIG. 4, the electrodes 23, 24 are of similar shape to 'combs' and are arranged so that one part 23a of one electrode 23 lies between two parts 24a of the other electrode 24. Electrolyte is positioned between the electrodes 23, 24.

In FIG. 5, the electrodes 25, 26 are spaced so that they diverge away from one another at one end and converge at the other. As before, electrolyte is placed between the two electrodes.

FIG. 6 illustrates schematically one possible embodiment of the invention in which a battery 27 is connected in series with an electrochemical device 28. A shunt resistor 29 is connected in parallel with the device 28 so that the current flowing through the device is minimized and the power delivered by the battery is not substantially reduced.

The shunt resistor 29 could be a length of wire having a lower resistance than the electrochemical device. Alternatively, the shunt resistor could be formed by a salt solution, for example potassium nitrate, which is dispersed throughout the electrolyte. This provides an electrical path which does not substantially affect the operation of the battery in its provision of current to a load.

One type of electrolyte which can be used is a coating applied to one or both of the electrodes through which current is passed as the battery supplies current to a load.

Specific examples of electrolytes in the form of a coating will now be described. The constituents of each coating were mixed, melted and poured into a Petri dish to form a layer having a thickness of approximately 2 mm. The constituents used to make the coatings were a photographic color coupler dispersion, a photographic silver halide color developer, and a dispersion of antioxidant (or scavenger). The color coupler may be one that forms a diffusible or a non-diffusible dye.

In each case, the coupler dispersion was a standard composition normally used in the manufacture of photographic color paper, the dispersion of antioxidant was used as a scavenger for oxidized developer, and the color developer was a standard composition used in color photography. In these particular cases, the color developer was retained in a binder of aqueous gelatin.

A series of tests were carried out using the electrolyte in the form of a coating. Current was passed through the electrolyte via a pair of electrodes.

Various tests were carried out as follows:

TEST 1 Variation of Voltage

A coating was made from the following materials:

| Material | Amount |
|---|---|
| Dispersion (A) | 22.5 g |
| Developer solution (C) | 2.5 ml |
| Dispersion (B) (scavenger) | 5.0 g |

The dispersions and developer solutions were as follows:

Dispersion (A):

2,4-dichloro-3-ethyl-5-(2,4-di-tertiary-pentyl-phenoxy-α-propionamido)phenol (coupler C1) was dissolved in dibutyl phthalate and dispersed in an aqueous gelatin solution forming a dispersion of the following composition:

| Coupler | 7.9% |
|---|---|
| Dibutyl phthalate | 4.3% |
| Gelatin | 10.0% |
| Diisopropyl naphthalene sulphonic acid (dispersant) | 0.25% |

The formula for the C1 coupler is shown below:

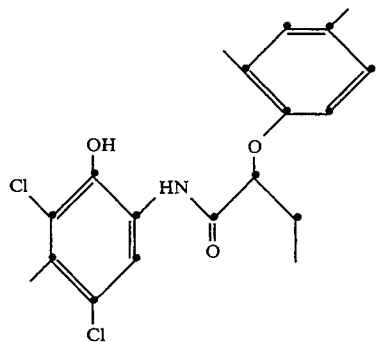

Scavenger Dispersion (B): Dioctylhydroquinone (DOH) was dissolved in dibutyl phthalate and dispersed in an aqueous gelatin solution forming a dispersion of the following composition:

| DOH | 1.8% |
|---|---|
| Dibutyl phthalate | 5.4% |
| Gelatin | 14.5% |
| Diisopropyl naphthalene sulphonic acid (dispersant) | 0.25% |

Developer solution (C): has the following composition:

| 4-N-ethyl-N-(β-methanesulphonamido-ethyl)-o-toluidine sesquisulphate | 4.5 g |
|---|---|
| Potassium sulphite | 0.2 g |
| Potassium carbonate | 25.0 g |
| Potassium chloride | 2.3 g |
| Water to | 1.0 liter | pH = 10.

The developer formula is given below:

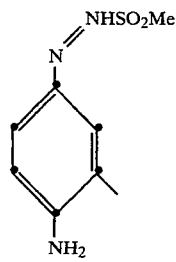

Platinum electrodes were used, each having a 2 mm diameter. The electrodes were positioned so that the free end of each electrode was resting on the coating in the Petri dish. Due to the color coupler used, a cyan color developed at the anode as current was passed through the electrochemical device so formed. The results were as given below:

| Voltage (V) | Current (mA) | Indication | Time (mins) |
|---|---|---|---|
| 1.0 | 7.2 | strong cyan | 15 |
| 0.5 | 3.5 | cyan | 10 |
| 0.2 | 1.3 | cyan | 20 |

TEST 2 Variation of Time at a Constant 0.2 V

A coating was made from the following materials:

| Material | Amount |
|---|---|
| Dispersion (A) | 40.0 g |
| Scavenger dispersion (B) | 10.0 g |
| Developer solution (C) | 4.0 ml |

Dispersions (A) and (B) and the developer solution (C) were as given in Test 1. Platinum electrodes were also used as in Test 1, and the following results were obtained:

| Time (mins) | Current (mA) | Indication |
|---|---|---|
| 10 | 0.9 | weak cyan color |
| 20 | 0.6 | cyan color |
| 40 | 1.0 | cyan color |
| 80 | 0.3 | strong cyan color |

A change in color was observed at the anode due to the formation of oxidized developer and reaction of this with color coupler.

Gold electrodes were also used, and similar results were obtained.

It was found that the formation of color at the anode depends on three parameters, namely:

(i) the current which is passed through the electrochemical device;

(ii) the time for which the current is passed through the device; and (iii) the concentration of the scavenger.

By adjusting the balance between these three parameters, it is possible to provide indications of the charge taken from a battery.

Further experiments were carried out using water soluble couplers in order to develop a system which would be more efficient electrochemically and provide a better indication since the dye formed would be more mobile.

In the tests above, the coupler dispersion (A) contained the 2 equivalent cyan coupler C1. This coupler is not water soluble. However, a water soluble 4 equivalent magenta coupler C2 was readily available and some initial evaluation experiments were conducted. The formula for C2 is shown below:

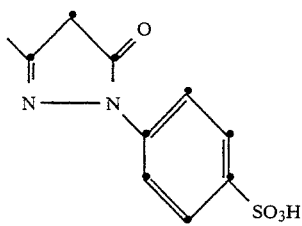

A water soluble version of C1 was made using the available intermediate which is already used for the synthesis of C1 itself. The scheme for making this water soluble version is shown below:

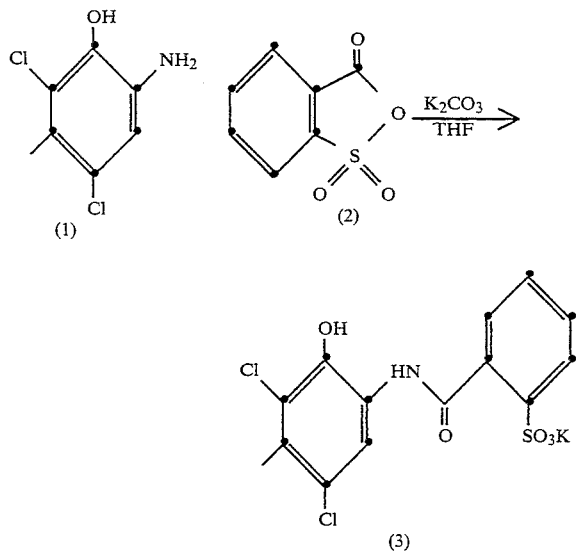

Treatment of the intermediate (1) with o-sulphobenzoic anhydride (2) with an inorganic base (potassium carbonate) gave a highly soluble analogue coupler C3 (3). C1 amine (25 mmol, 5.15 g) was dissolved in THF (100 ml); potassium carbonate (25 mmol, 3.46 g) was suspended in the solution. o-sulphobenzoic anhydride (25 mmol, 4.61 g) was dissolved in THF (30 ml) and this solution was added dropwise to the mixture with vigorous stirring. The mixture was stirred for 16 hours, after which time the solution was concentrated to about half of its original volume and the precipitate was removed and collected by filtration giving the crude product C3 as a brown-pink solid (10.81 g). Recrystallization (EtOH/water, 9: , 50 ml) of a sample (5.5 g) gave the pure product as a pale pink solid (2.11 g, 39%, non-optimized). This compound coupled to give a stable cyan dye. Subsequent evaluation experiments were carried out using C3.

The original dispersions contained DOH, a hydroquinone derivative which is insoluble in water. However, the potassium salt of hydroquinone sulphonic acid (HQSA) is highly soluble in water and has similar reducing power to DOH. Furthermore, it was found that the oxidized form of HQSA (obtained by treating HQSA with potassium persulphate in aqueous solution) did not give rise to magenta or cyan dyes on attempted coupling with C2 and C3 respectively. This means that colored side reaction products are not obtained which could be misinterpreted as a positive indication in the battery indicator.

The color developer as used in the previous tests was used as it is highly soluble in water.

Potassium carbonate was used as the base as in the original tests, giving solutions having a pH of approximately 12.

Gelatin was retained as the binder for the composition.

Preferred compositions were selected for use in both cyan and magenta systems. A composition was also selected if it is preferred to work at lower pH values. These three compositions are as given below:

| Composition 1 (cyan system) | |
| --- | --- |
| Coupler (C3) | 11.4 mmol |
| Reducing species (HQSA) | 0.025 mmol |
| Developer | 0.1 mmol |
| Base (potassium carbonate) | 25.0 mmol |
| Water | 25 ml |

200 μl of this solution added to gelatin solution (20%, 2 ml)

| Composition 2 (magenta system) | |
| --- | --- |
| Coupler (C2) | 1.0 mmol |
| Reducing species (HQSA) | 1.0 mmol |
| Developer | 0.1 mmol |
| Base (potassium carbonate) | 25.0 mmol |
| Water | 30 ml |

Added to gelatin solution (20%, 10 ml)

| Composition 3 (lower pH) | |
| --- | --- |
| Coupler (C3) | 0.234 mmol |
| Reducing species (HQSA) | 0.05 mmol |
| Developer | 0.1 mmol |
| Base (potassium carbonate) | 10.85 mmol |
| Water | 25 ml |

200 μl of this solution added to gelatin solution (20%, 2 ml)

The composition used in the original tests is given below:

| Coupler (C1) | 3.5 mmol |
| --- | --- |
| Reducing species (HQSA) | 0.269 mmol |
| Developer | 0.013 mmol |
| Base (potassium carbonate) | 0.378 mmol |

The test compositions were prepared by using the amounts of the components listed above and following a general procedure. The coupler (C1 or C3) was suspended in water, and potassium carbonate was added gradually with stirring. HQSA and developer were each dissolved in the minimum amount of water, and were added sequentially. The resultant solution was added to the gelatin solution (20%) at 40° C., and after vigorous stirring the mixture was poured into the case and allowed to set at 4° C.

The electrochemical experiments were then carried out using the required composition set in a Petri dish. A voltage was passed across two platinum electrodes and where possible the current generated was measured.

Using composition 2, a voltage of 0.998 mV gave a magenta color after 10 minutes with a current of 10 $\mu$A with the color intensifying over 30 minutes.

In order to reduce the size of the cell to that which would be required for a battery indicator, conductive coated transparent electrodes (doped tin oxide coated on glass) were used. A conductive terminal was silver-soldered onto the coated side of the plate to enable a contact to be made with a crocodile clip. The gel mixtures were poured onto the conductive side of the plate and enclosed in a plastic former of diameter 10 mm. The gel was allowed to set and the second conductive coated transparent electrode was contacted on top and connected into the circuit. A current was passed as before. When composition 2 was used, a magenta color was formed as before by passing a voltage of 0.998 mV.

Similar results were obtained for compositions 1 and 3.

However, a color change was obtained within 10 minutes indicating the higher reactivity of the cyan coupler. Attempts to reduce the voltage to 0.50 mV gave no dye formation after 3 hours and no measurable current. This showed that dye generation could be controlled by varying the voltage.

It was also noted that with the more active cyan coupler, atmospheric oxygen could slowly oxidize the developer in the coating to generate a faint cyan dye across the surface. A further experiment was carried out using composition 3. Composition 3 (without the gel) was left under a current of argon for 30 minutes and then sealed. Only very minimal discoloration was observed in this solution after 16 hours, whereas in a control experiment (kept in air), faint cyan dye was observed after 2 to 3 hours. This indicates that stable indicator systems could be manufactured using anaerobic storage. Alternatively, a small amount of anti-oxidant could be added to the composition prior to the addition of the developer.

Other compositions could be used, although those listed above are preferred at present. Examples of other possible compositions for the magenta and cyan systems are listed below

| Composition A (magenta system) | |
| --- | --- |
| Coupler (C2) | 3.5 mmol |
| Reducing species (HQSA) | 0.269 mmol |
| Developer | 0.013 mmol |
| Base (potassium carbonate) | 2.128 mmol |
| Water | 10 ml |

Added to gelatin solution (20%, 10 ml)

| Composition B (magenta system) | |
| --- | --- |
| Coupler (C2) | 3.5 mmol |
| Reducing species (HQSA) | 0.269 mmol |
| Developer | 0.013 mmol |

| Composition B (magenta system) | |
| --- | --- |
| Base (potassium carbonate) | 11.01 mmol |
| Water | 10 ml |

Added to gelatin solution (20%, 10 ml)

| Composition C (cyan system) | |
| --- | --- |
| Coupler (C3) | 3.60 mmol |
| Reducing species (HQSA) | 0.01 mmol |
| Developer | 0.04 mmol |
| Base (potassium carbonate) | 10.00 mmol |
| Water | 10 ml |

200 $\mu$l of this solution added to gelatin solution (20%, 2 ml)

| Composition D (cyan system) | |
| --- | --- |
| Coupler (C3) | 0.234 mmol |
| Reducing species (HQSA) | 0.025 mmol |
| Developer | 0.1 mmol |
| Base (potassium carbonate) | 10.85 mmol |
| Water | 25 ml |

200 $\mu$l of this solution added to gelatin solution (20%, 2 ml)

A coupler which forms a diffusible dye on coupling can also be used to produce a color change in a mordant layer. This coupler releases a chromophore when it is oxidized and the dye is then forced to diffuse to the mordant layer where it is immobilized. Such a coupler could be used where it is desired to produce a change in color remote from the electrochemical device.

Other binders apart from gelatin may be used.

The salt solution which could be used to form a shunt resistor may be chosen to be hygroscopic so that the electrolyte is maintained at the correct humidity to allow conduction through the shunt resistor to take place. Alternatively, or additionally, the binder may also be hygroscopic.

Other oxidation processes can be utilized in the electrochemical device, and different scavengers can be used to produce different color changes.

As an alternative to the electrochemical action of the electrochemical device causing a positive change in color, for example from white (or clear) to blue, a color could be bleached out during the electrochemical action of the device.

Reduction processes can also be used to provide the visual indication of the charge remaining in a battery.

Batteries have a predetermined shelf-life. Atmospheric oxidation could be utilized to indicate the expiry of the shelf-life of the battery in a similar way.

The electrochemical device can be formed with the battery, or may be added to it later by a user of the battery.

The electrochemical device of the present invention may be used with rechargeable batteries, where as the battery is discharged the device darkens, and as the battery is recharged, the color of the device reverts one which designates the fully charged condition.

A further application of the present invention is as a 'time of use' indicator where the change in color is used to indicate the amount of time for which a current passes through the device, thereby indicating the time for which the device to which it is attached has been in an energized condition.

Yet a further application of the present invention, is as a disposable electricity meter. The device, perhaps formed on a card (such as a 'Phonecard' or credit card), gives a visual indication of the amount of charge (or any other unit which could be converted to an electrical signal) has been used.

We claim:

1. An electrochemical device for providing a visual indication of the remaining life of a battery, the device comprising an electrode pair with a layer therebetween, the layer comprising a mixture of a photographic color coupler dispersion, an antioxidant and a photographic color developer in a binder.

2. A device according to claim 1, wherein one electrode of the electrode pair comprises a mesh electrode.

3. A device according to claim 1, wherein one electrode of the electrode pair comprises a printed circuit electrode.

4. A device according to claim 3, wherein a second electrode of the electrode pair is a printed circuit electrode, and both electrodes are arranged in the form of interlocking combs.

5. A device according to claim 2 or 3, wherein said second electrode of the electrode pair is a flat electrode.

6. A device according to claim 1, wherein the electrode pair is a pair of parallel printed circuit electrodes.

7. A device according to any one of claims 1 to 4, and further including a transparent substrate, at least one electrode of the electrode pair being formed on said transparent substrate.

8. In a battery with a visual indicator, the improvement wherein said indicator comprises a device as defined in any of claims 1 to 4.

9. A method of making a battery having a visual indication of its remaining life, comprising the steps of
   a) providing an electrode pair and a layer between the pair comprising a mixture of a photographic color coupler dispersion, an antioxidant and a photographic color developer in a binder, and
   b) attaching said pair and said layer to the outside of a battery so that said pair and said layer are electrically connected to said battery and said layer is visible, whereby an electrochemical process in said layer produces a visible optical change in said layer.

* * * * *